(12) United States Patent
Allen et al.

(10) Patent No.: US 10,854,765 B2
(45) Date of Patent: Dec. 1, 2020

(54) VOLTAGE-MODE PHOTOSENSITIVE DEVICE

(71) Applicant: Emberion Oy, Espoo (FI)

(72) Inventors: Mark Allen, Cambridge (GB); Alexander Bessonov, Cambridge (GB); Tapani Ryhänen, Helsinki (FI)

(73) Assignee: EMBERION OY, Espoo (FI)

( * ) Notice: Subject to any disclaimer, the term of this patent is extended or adjusted under 35 U.S.C. 154(b) by 50 days.

(21) Appl. No.: 16/257,412

(22) Filed: Jan. 25, 2019

(65) Prior Publication Data

US 2019/0221686 A1 Jul. 18, 2019

(30) Foreign Application Priority Data

Jan. 26, 2018 (GB) .................................. 1801336.7

(51) Int. Cl.
*H01L 31/0224* (2006.01)
*H01L 31/113* (2006.01)
*H01L 31/0352* (2006.01)
*H01L 31/108* (2006.01)

(52) U.S. Cl.
CPC ......... *H01L 31/022408* (2013.01); *H01L 31/035218* (2013.01); *H01L 31/108* (2013.01); *H01L 31/113* (2013.01); *H01L 31/1136* (2013.01)

(58) Field of Classification Search
CPC ........... H01L 31/022408; H01L 31/113; H01L 31/035218
See application file for complete search history.

(56) References Cited

U.S. PATENT DOCUMENTS

2019/0221686 A1* 7/2019 Allen .................... H01L 31/113

FOREIGN PATENT DOCUMENTS

| CN | 104766902 A | 7/2015 |
|---|---|---|
| CN | 106505115 A | 3/2017 |
| EP | 2975652 A1 | 1/2016 |
| EP | 3107127 A1 | 12/2016 |
| EP | 3206235 A1 | 8/2017 |
| EP | 3252831 A1 | 12/2017 |

* cited by examiner

*Primary Examiner* — Mark V Prenty
(74) *Attorney, Agent, or Firm* — Squire Patton Boggs (US) LLP

(57) ABSTRACT

A photosensitive device that includes a conductive electrode, a dielectric layer, a sensing electrode composed of a two-dimensional layered material, and a photoactive layer which can be configured to absorb electromagnetic radiation. The photosensitive device also includes a single-ended measurement electrode for determining the electric potential of the sensing electrode.

13 Claims, 16 Drawing Sheets

US 10,854,765 B2

VOLTAGE-MODE PHOTOSENSITIVE DEVICE

CROSS-REFERENCE TO RELATED APPLICATIONS

Figure 1:
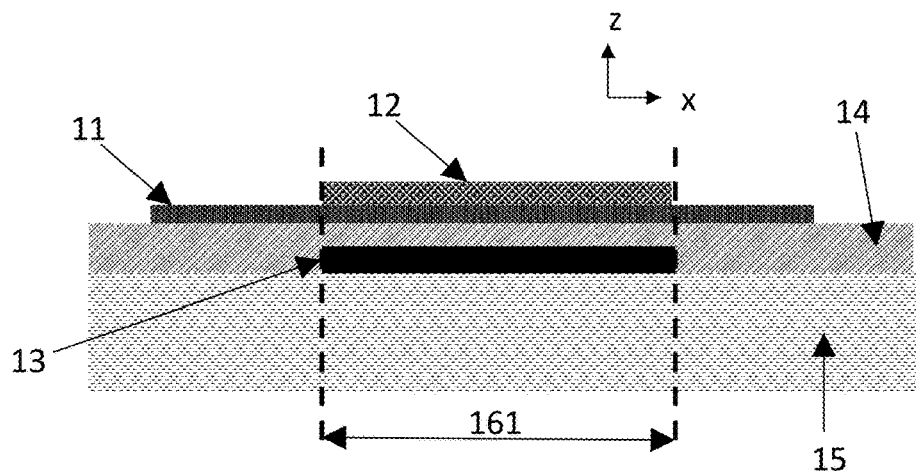

The present application claims priority under 35 U.S.C. § 119 to United Kingdom Patent Publication No. 1801336.7 (filed on Jan. 26, 2018), which is hereby incorporated by reference in its complete entirety.

TECHNICAL FIELD

The present disclosure relates to photosensitive sensors which can be used to measure the intensity of incident electromagnetic radiation, and more particularly to photosensitive sensors where a two-dimensional layered material is used as a sensing electrode. The present disclosure further concerns photodetectors which comprise a plurality of photosensitive pixels.

BACKGROUND

Photosensitive devices which utilize two-dimensional layered materials as transistor channels can be used to detect electromagnetic radiation at wavelengths ranging from infrared to ultraviolet. A graphene field-effect transistor (GFET), for example, comprises a semiconducting graphene channel whose conductivity increases when it is illuminated by electromagnetic radiation. This increased conductivity can be measured in a field-effect transistor geometry where the current from a source electrode and a drain electrode is controlled by a gate voltage applied to an electrode adjacent to the channel.

Radiation absorption in one layer of two-dimensional material is typically limited to a few percentage points of the total radiation intensity at most wavelengths, but the absorption and spectral responsivity of a field-effect transistor can be increased by preparing an additional photoactive layer adjacent to the graphene channel. The photoactive material is typically semiconducting.

With the addition of a photoactive layer, a built-in electric field may be formed between the photoactive layer and the two-dimensional layered material in thermodynamic equilibrium. This facilitates trapping of either minority or majority charge carriers in the photoactive layer when electromagnetic radiation illuminates the photoactive material. Corresponding majority carriers can move to the transistor channel. The photoactive layer thereby donates charge carriers to the two-dimensional layered material when illuminated and changes the conductivity of the two-dimensional layered material. This carrier multiplication process can be configured to make the source-drain current in the transistor proportional to radiation intensity.

By selecting a semiconductor with a given optical bandgap to the photoactive layer, the photosensitive sensor can be sensitized to respond particularly strongly to radiation wavelengths which exceed this bandgap.

Document US20150364545 discloses a field-effect transistor with semiconducting layers adjacent to a graphene layer.

However, field-effect transistors have certain inherent drawbacks. The output variable which changes with radiation intensity is a current flowing between the source and the drain electrode. Source and drain electrode arrangements must be relatively complex to enable current measurements across the whole pixel area.

SUMMARY

An object of the present disclosure is to provide an apparatus for alleviating the disadvantages stated above.

The object of the disclosure is achieved by apparatuses which characterized by what is stated in the independent claims. The preferred embodiments of the disclosure are disclosed in the dependent claims.

The disclosure is based on the idea of utilizing a two-dimensional layered material, combined with a photoactive layer, as a voltage-mode photosensitive sensor where the electric potential of the two-dimensional layered material is configured to be proportional to the intensity of electromagnetic radiation incident on the sensor.

An advantage of this arrangement is that the output signal from the photosensitive sensor can be read with a single-ended measurement electrode which is subject to less stringent geometry and coverage requirements than double-ended measurement electrodes are. Other advantages are also stated below.

DRAWINGS

Figure 2A:
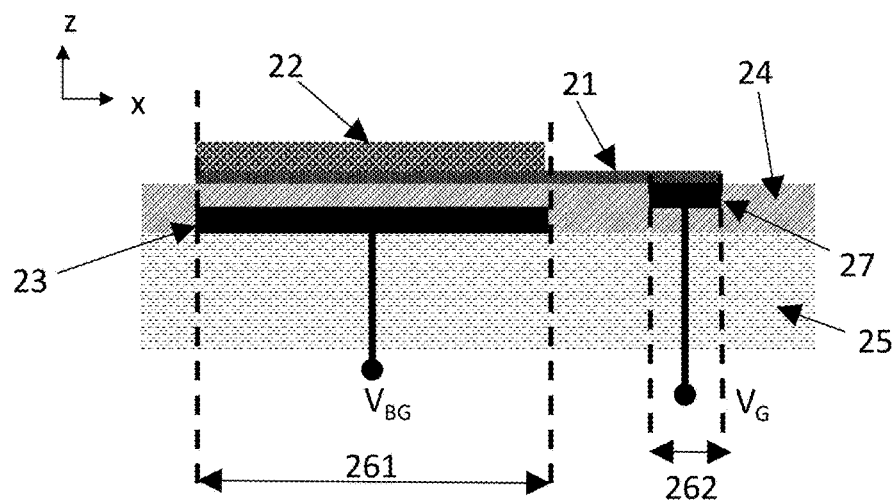
Figure 2B:
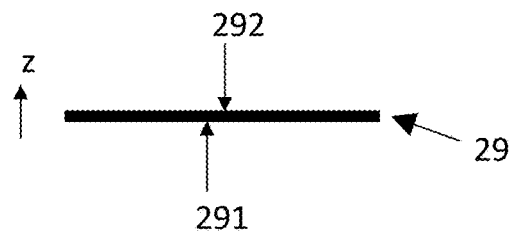
Figure 2C:
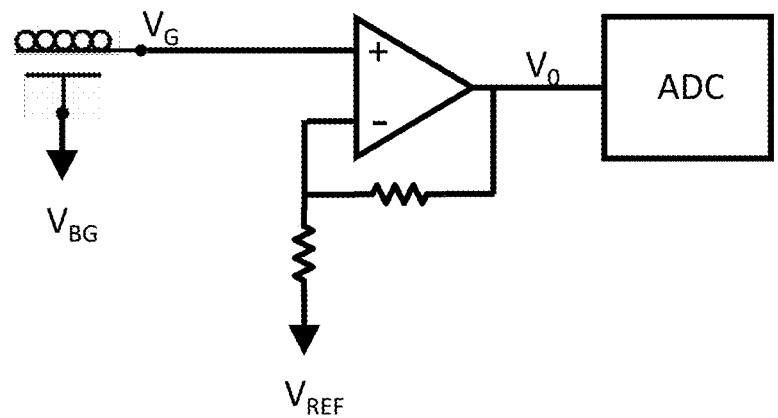
Figure 2D:
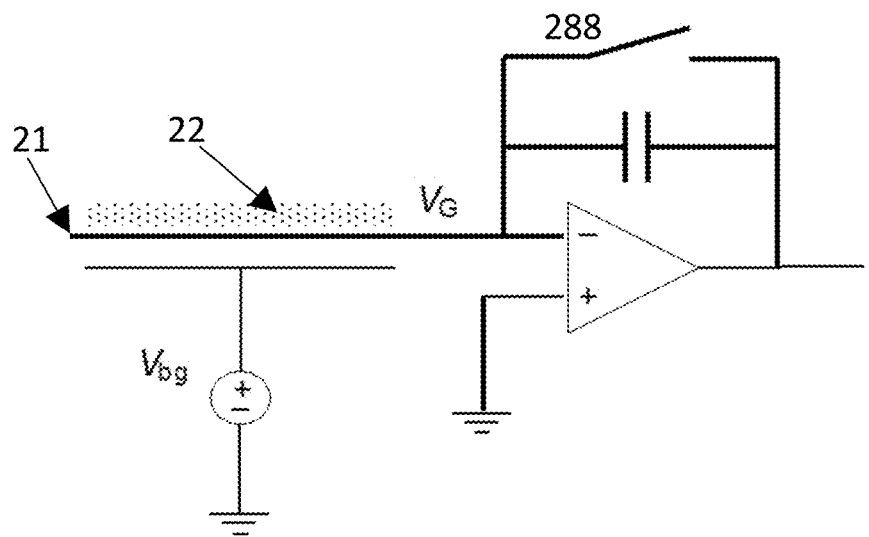
Figure 2E:
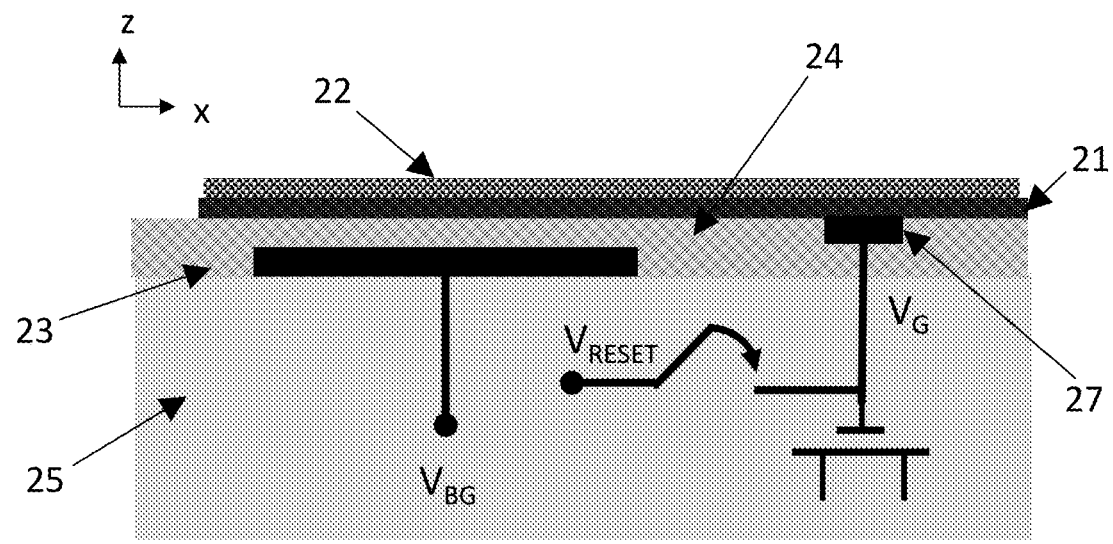
Figure 2F:
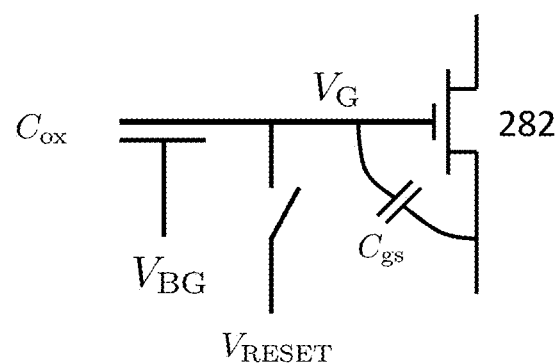
Figure 2G:
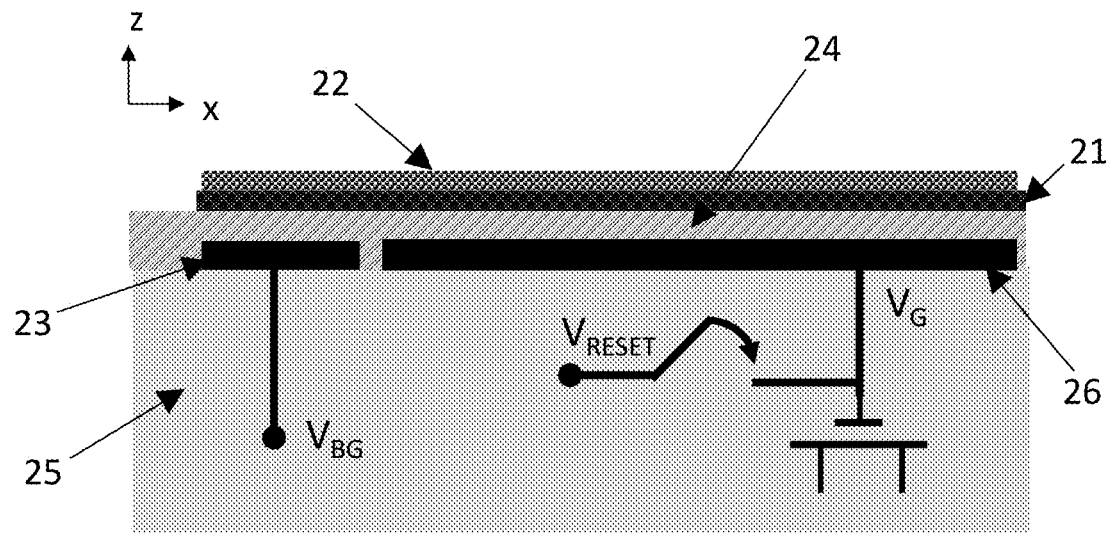
Figure 2H:
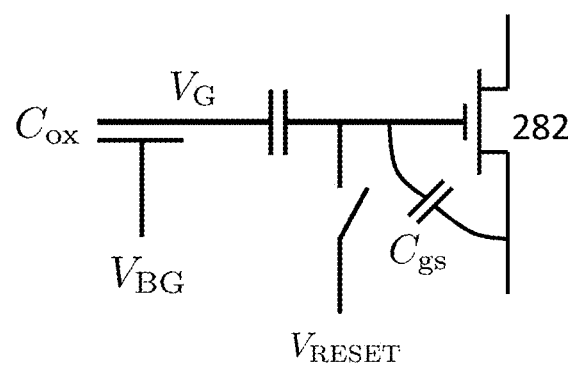
Figure 2I:
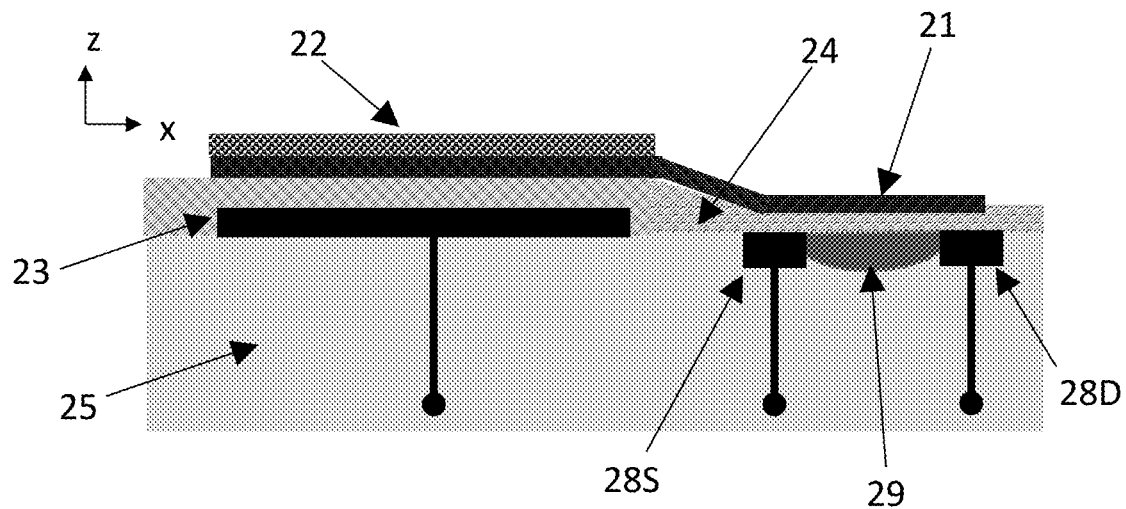
Figure 2J:
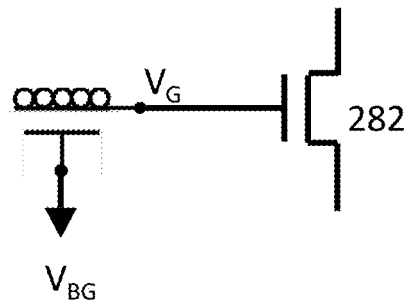
Figure 2K:
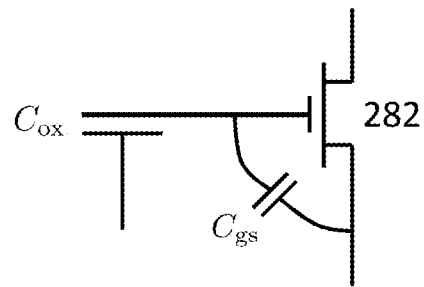
Figure 2I:
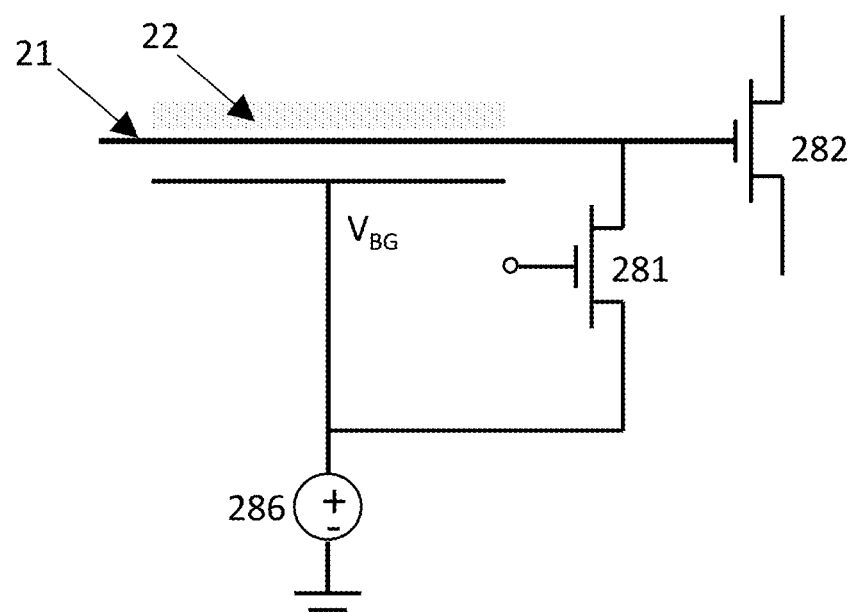
Figure 3A:
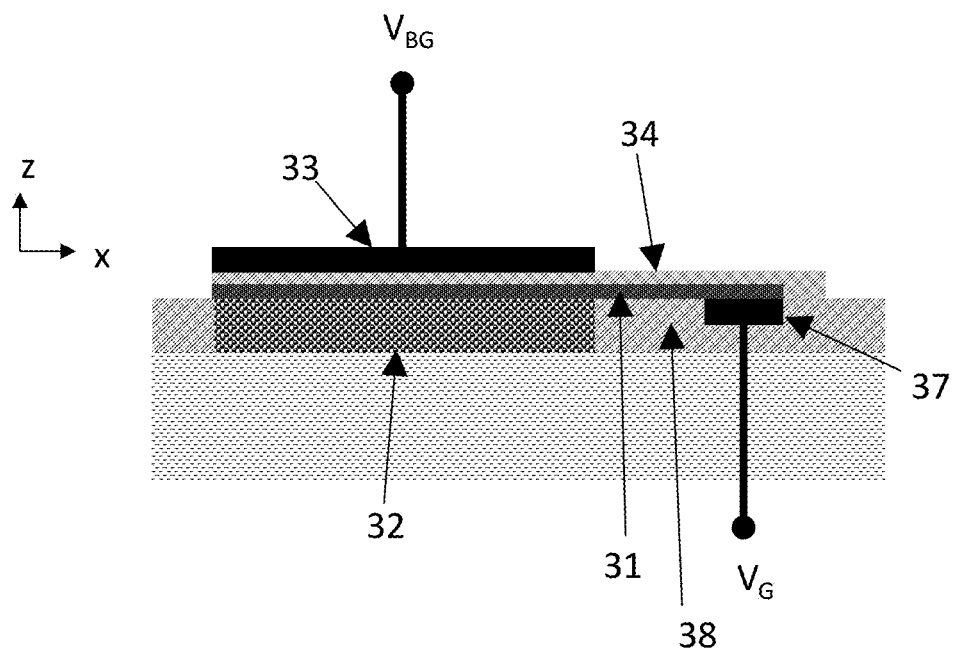
Figure 3B:
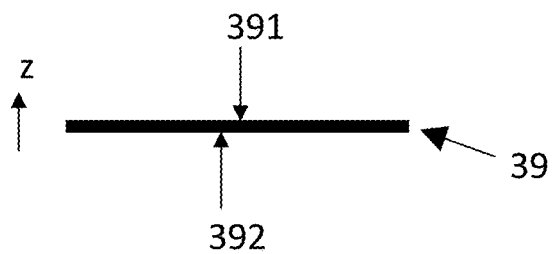
Figure 4A:
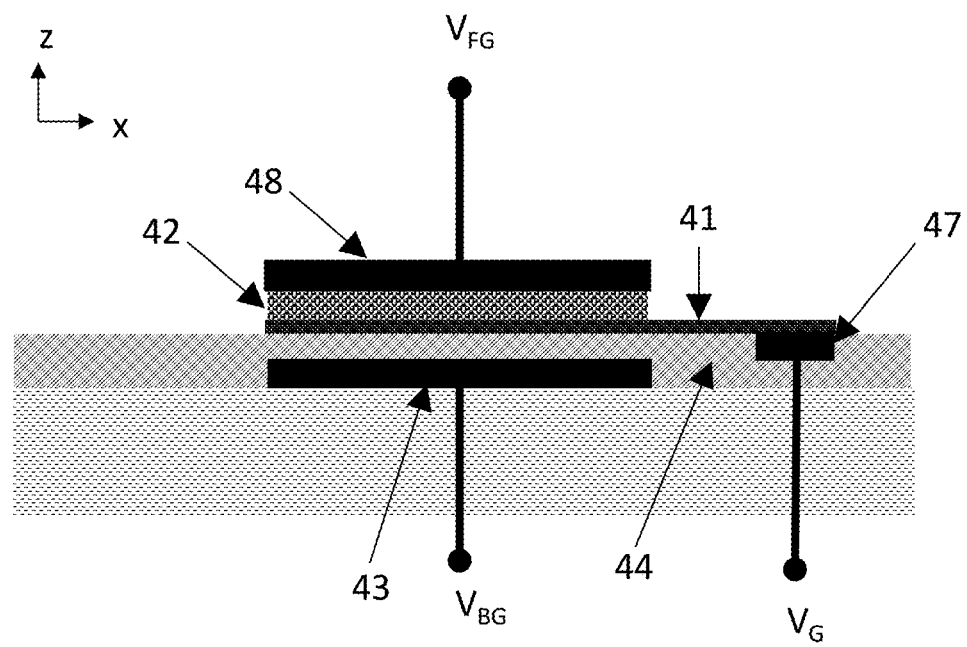
Figure 4B:
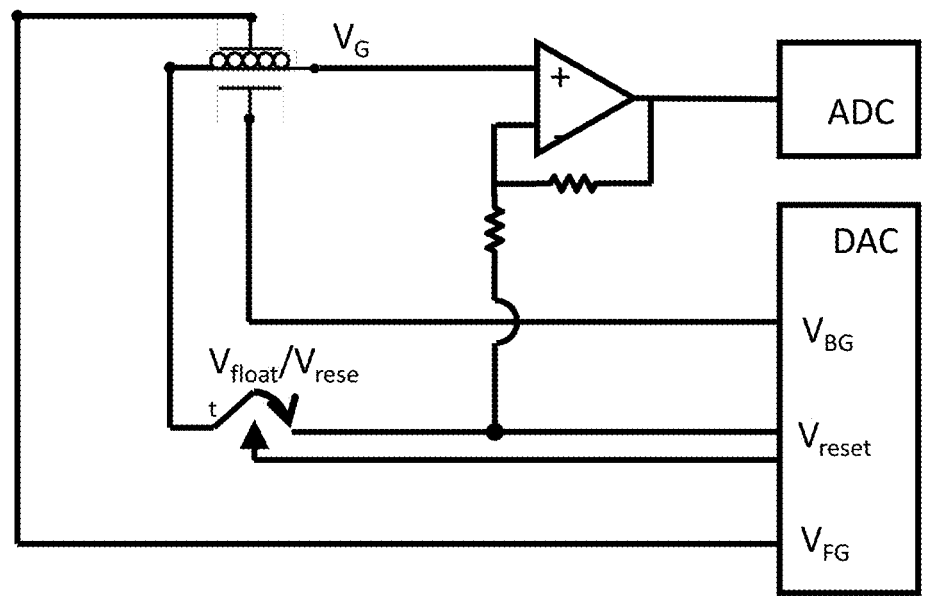
Figure 5:
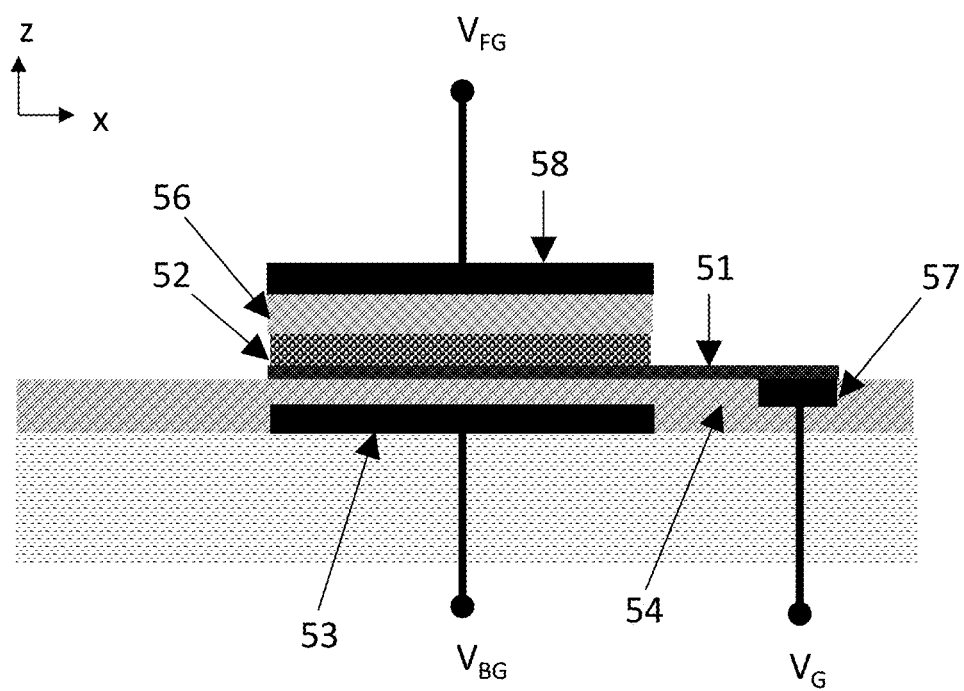
Figure 6A:
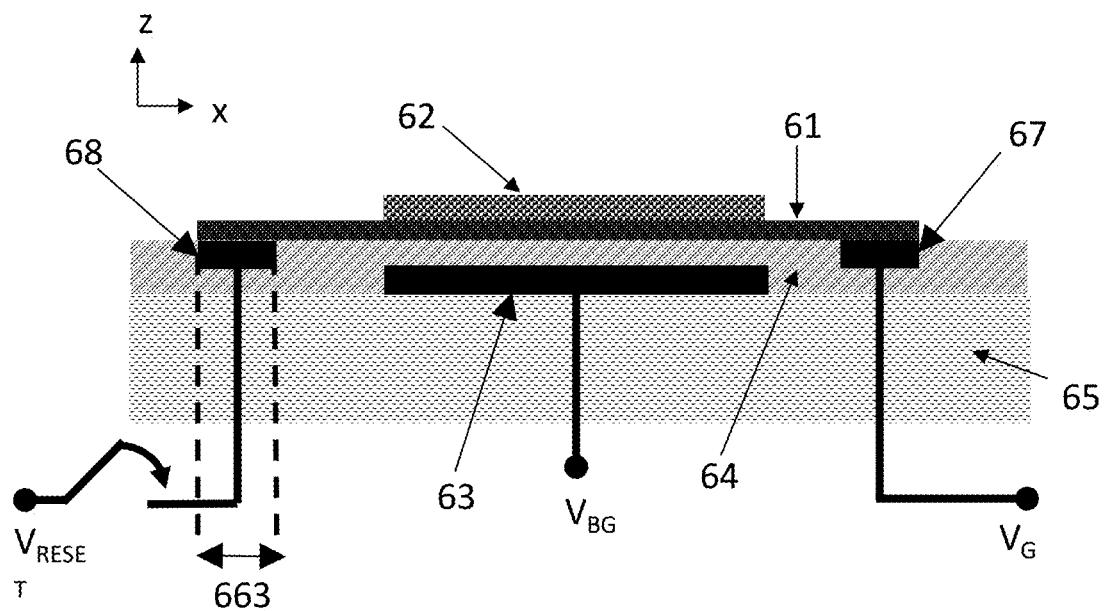
Figure 6B:
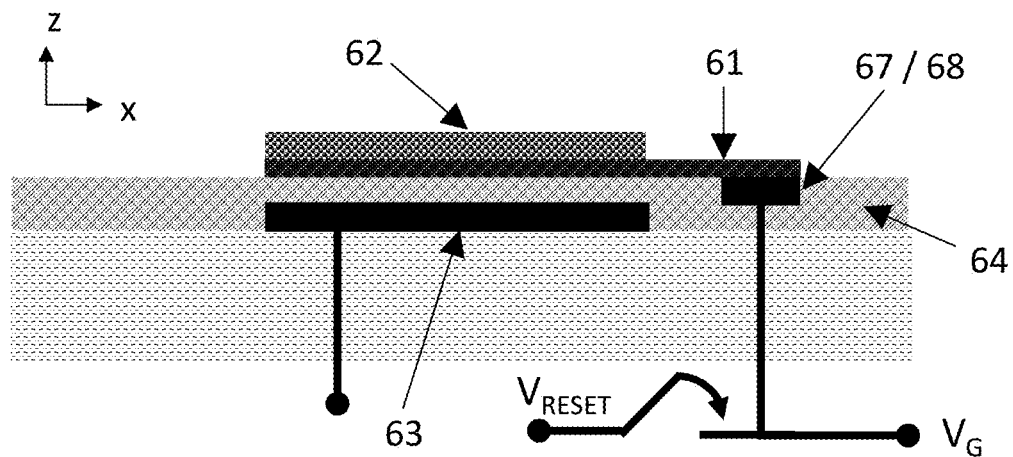
Figure 6C:
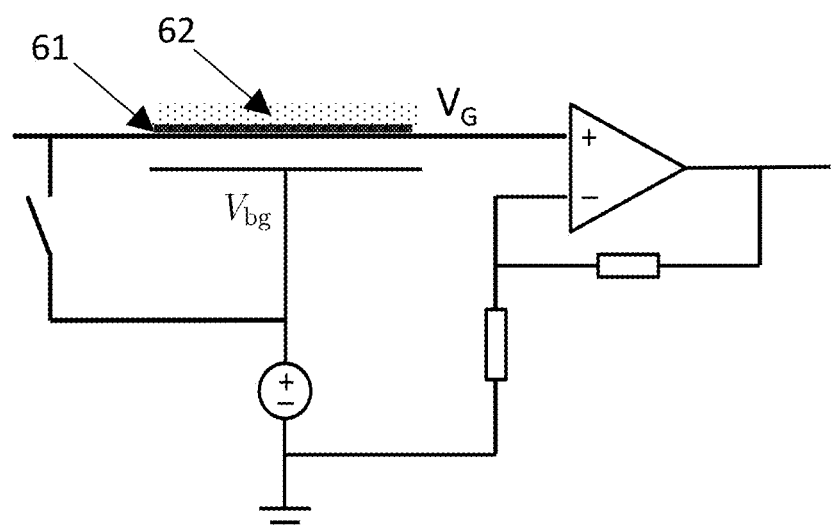
Figure 7A:
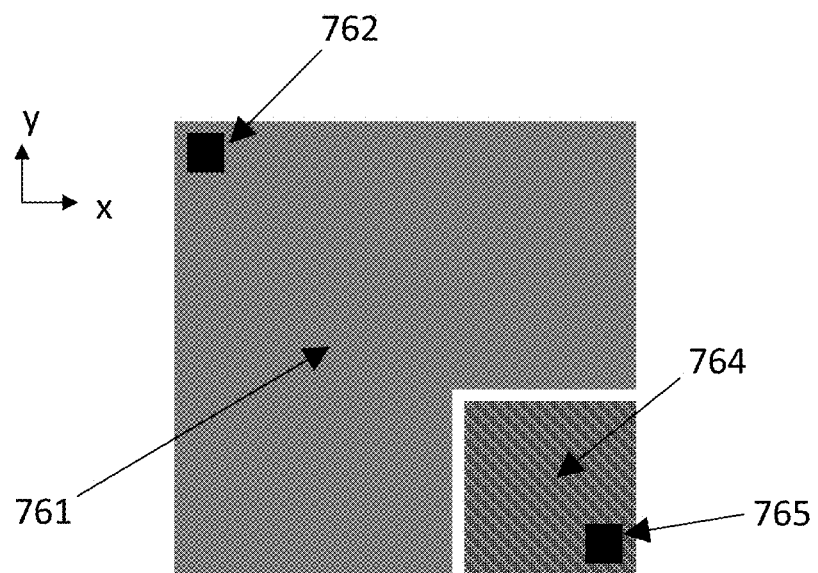
Figure 7B:
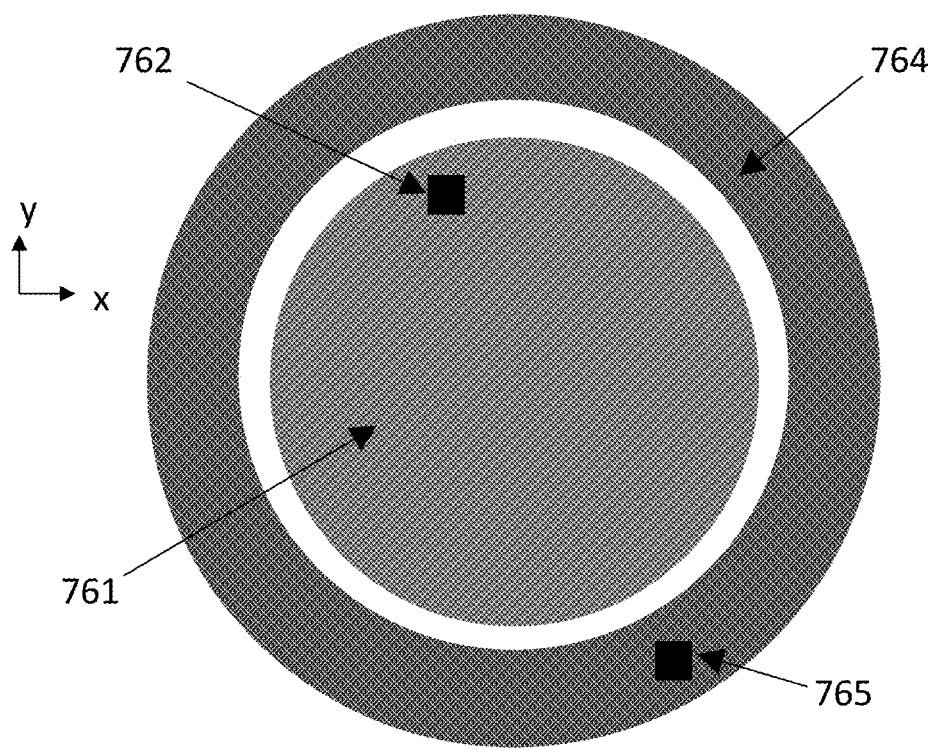
Figure 7C:
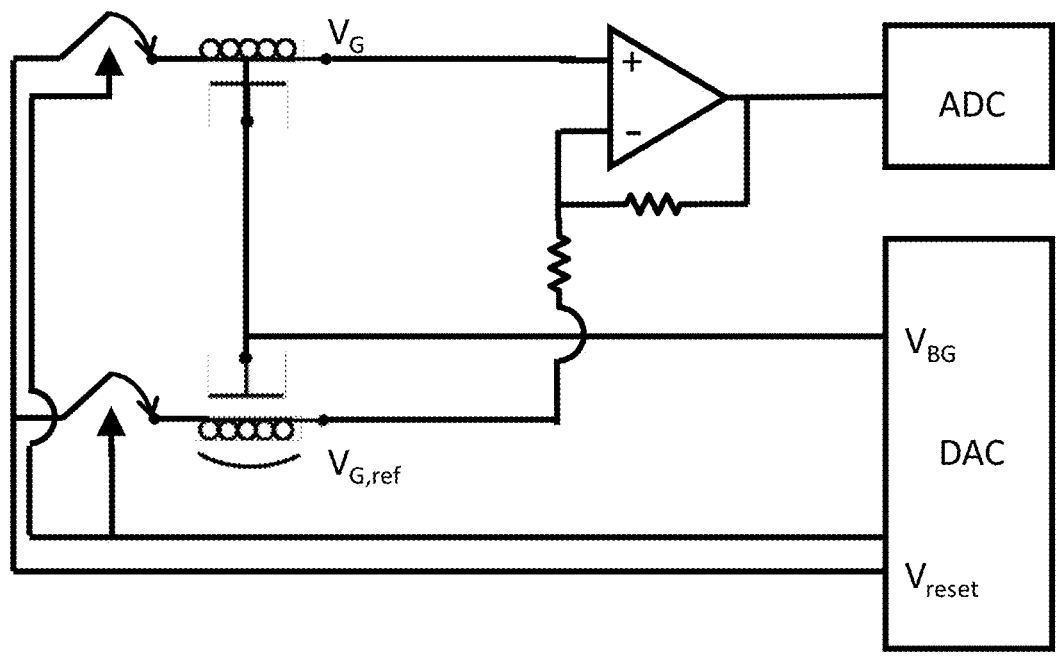
Figure 8A:
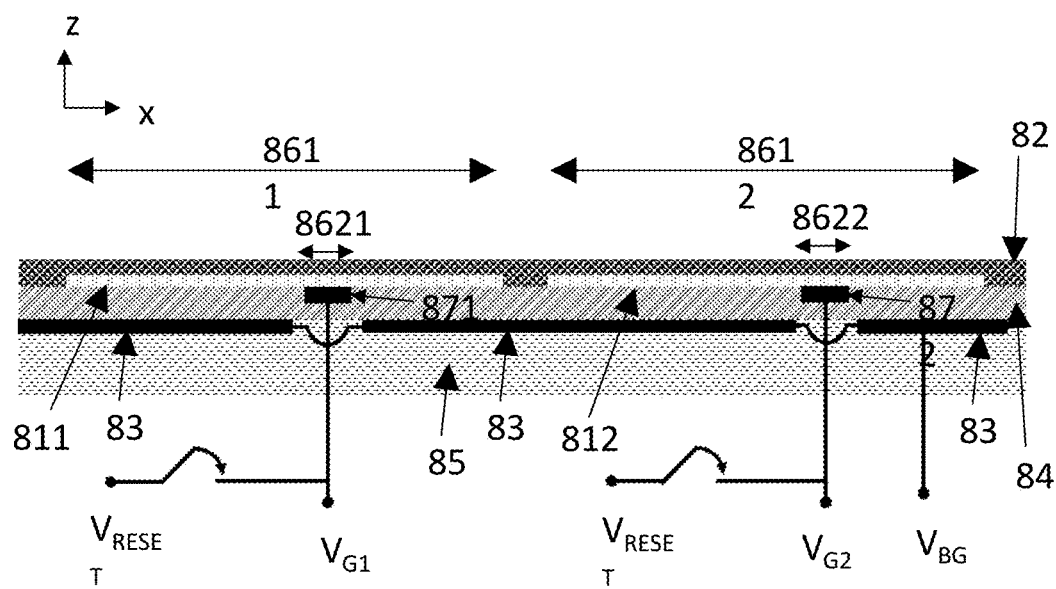
Figure 8B:
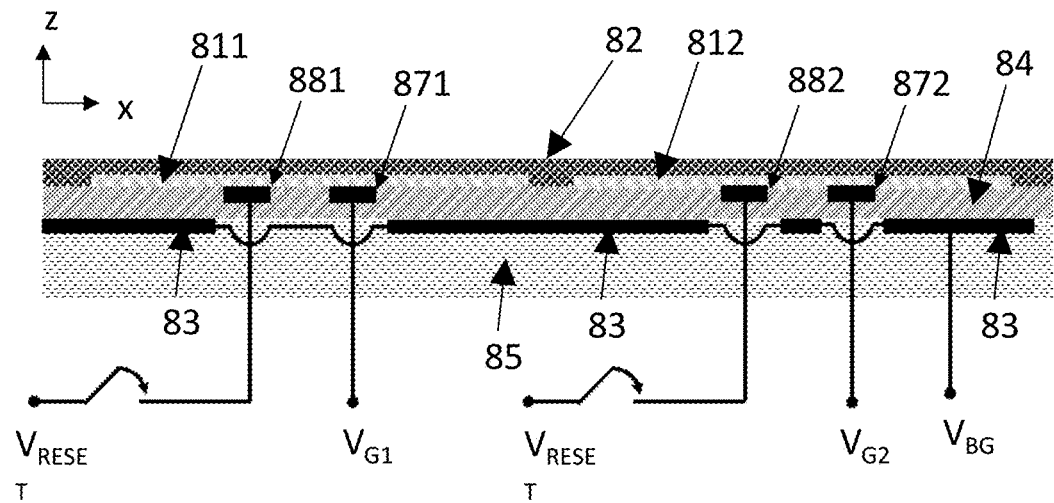
Figure 8C:
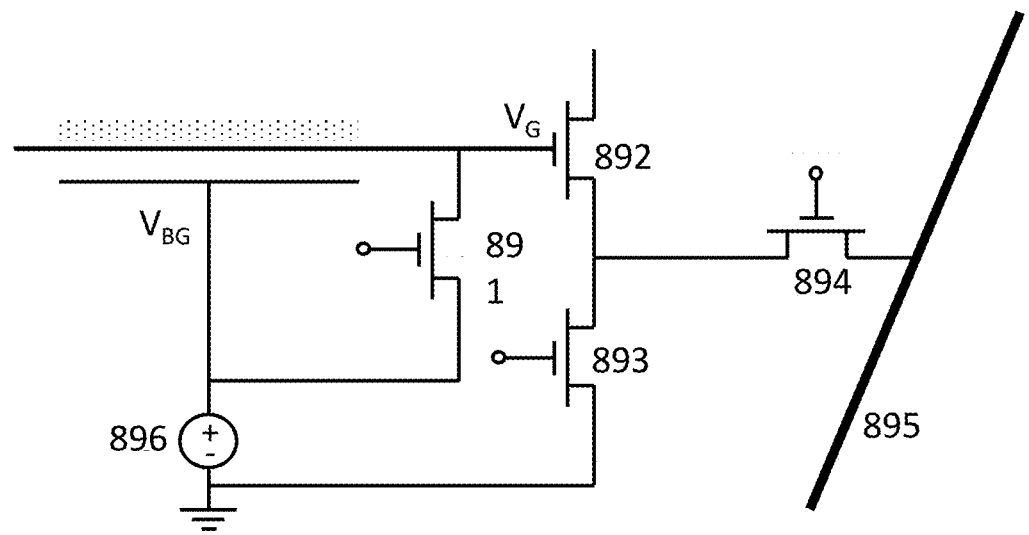
Figure 8D:
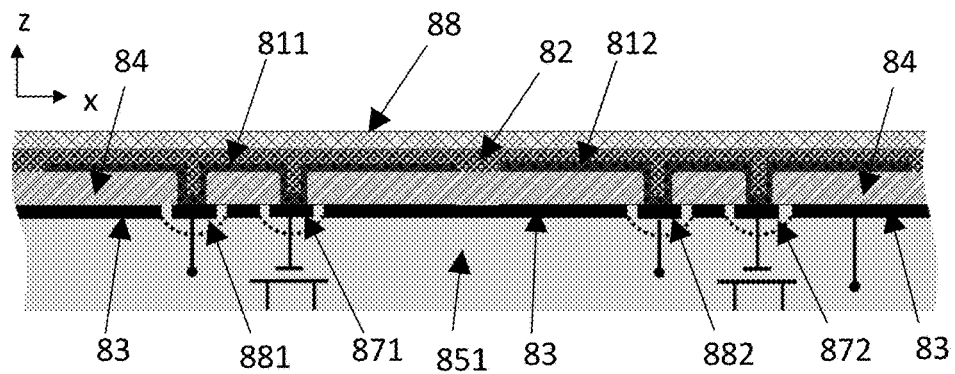
Figure 8E:
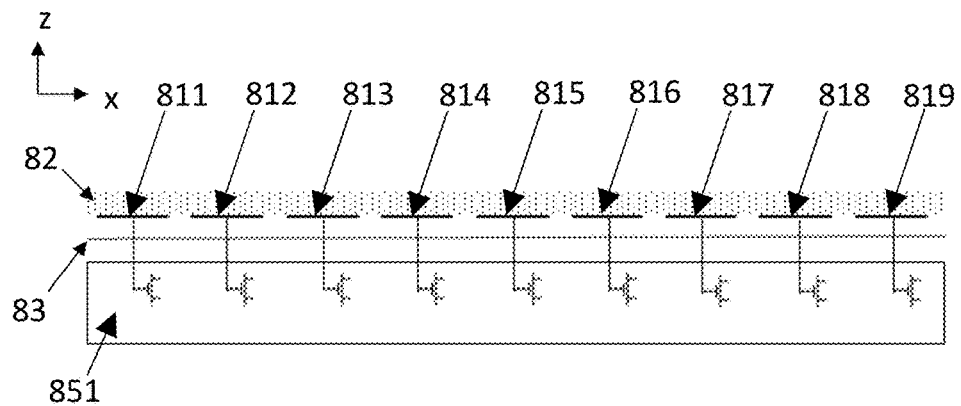

In the following the disclosure will be described in greater detail by means of preferred embodiments with reference to the accompanying drawings, in which:

FIG. 1 illustrates a voltage-mode photosensitive device.
FIGS. 2a-2b illustrate a first device embodiment.
FIGS. 2c-2d illustrate corresponding exemplary measurement circuits.
FIGS. 2e, 2g and 2i illustrate photosensitive devices connected to preamplifier gate electrodes.
FIGS. 2f, 2h and 2j-2l illustrate corresponding exemplary measurement circuits.
FIGS. 3a and 3b illustrate a second device embodiment.
FIG. 4a illustrates a third device embodiment.
FIG. 4b illustrates an exemplary measurement circuit.
FIG. 5 illustrates a fourth device embodiment.
FIGS. 6a and 6b illustrate a fifth device embodiment.
FIG. 6c illustrates an exemplary measurement circuit.
FIGS. 7a and 7b illustrate a sixth device embodiment.
FIG. 7c illustrates an exemplary measurement circuit.
FIGS. 8a, 8b and 8d illustrate photodetectors.
FIGS. 8c and 8e illustrate exemplary measurement circuits.
FIGS. 9a-9e illustrate exemplary pixel geometries.

DESCRIPTION

FIG. 1 illustrates a voltage-mode photosensitive device where a two-dimensional layered material is used as the sensing electrode 11. The device comprises a photoactive layer 12 which at least partly covers the sensing electrode 11. The device also comprises a first conductive electrode 13, which forms a capacitor with the sensing electrode 11. A first dielectric layer 14 is partly covered by the sensing electrode 11, and the first dielectric layer 14 in turn covers the first conductive electrode 13, so that the capacitor is formed between the two electrodes. All of these layers have been deposited on the horizontal top surface of a substrate 15.

In this disclosure, the term "horizontal" refers to the xy-plane, partially illustrated with the x-axis in FIG. 1, while the term "vertical" refers to the z-direction. In this disclosure, expressions such as "substantially horizontal layer" mean that the primary orientation of that layer is determined by the substrate plane. The layer may have been deposited over other layers which comprise small vertical steps, but nevertheless be substantially horizontal due to its primary orientation. Furthermore, terms such as "top," bottom", "vertical" and "horizontal" do not imply anything about the orientation of the substrate when the device is manufactured, or when the device is in use. The device and the substrate may be oriented in any suitable direction during usage and manufacturing, for example sideways in such a manner that a layer which is in this disclosure referred to as "horizontal", becomes vertical. In other words, the terms "horizontal" and "vertical" merely define two orthogonal directions, one of which is parallel to the substrate surface, and the other of which is normal to this surface.

In FIG. 1, a first region 161 can be defined on the horizontal substrate surface. This region is defined by the area where the photoactive layer 12 is interfaced with the sensing electrode 11, and where the first sensing electrode overlies the conductive electrode 16.

When the device illustrated in FIG. 1 is not illuminated by radiation, the charge density in the sensing electrode 11 is determined by the electric potential $V_{BG}$ applied to the first conductive electrode 13. The capacitor between electrodes 11 and 13 attracts electrons or holes from the photoactive layer 12 until the Fermi-level is equal across the 11/12 interface. This creates a depletion region, and consequently an internal field, at the 11/12 junction. The first conductive electrode may also be called a back gate electrode, since the function it performs is similar to that of a gate electrode in a field-effect transistor. The sensing electrode may also be called a charge-modulated layer or potential-modulated layer.

When electromagnetic radiation is absorbed in the photoactive layer 12, a portion of the electron-hole pairs released by the radiation are separated by the internal electric field at the 11/12 interface. The released charge carriers which remain in the photoactive layer are trapped in this layer. The concentration of these trapped charge carriers will typically be proportional to the intensity of incident electromagnetic radiation, at least under low illumination intensities. The photoactive layer may also be called a charge-trapping layer.

On the other hand, the charge carriers of opposite type, which are released by radiation and then transferred across the 11/12 interface before they have a chance to recombine, change the charge density of the sensing electrode. It is a unique property of two-dimensional layered materials that the additional charge transferred across the interface changes the charge density per unit area of the two-dimensional material to an extent which can be measured.

This change in charge density alters the electric potential of the sensing electrode by the amount $\Delta V_G$, which can be expressed as:

$$\Delta V_G = \left(\frac{\partial V_G}{\partial n_G}\right)\Delta n_G = \frac{e}{C_{ox}}\Delta n_G \approx \frac{e}{C_{ox}}\Delta n_{trapped}$$

where e is the units charge, $C_{ox}$ is the capacitance of the 11/13 capacitor, $\Delta n_G$ is change in charge carrier density in the two-dimensional material, and $\Delta n_{trapped}$ is the density of charge carriers trapped in the photoactive layer.

In other words, by measuring the electric potential of the sensing electrode first in a non-illuminated state and then under illumination, the intensity of that illumination can be determined from the measured electric potential.

In the exemplary embodiments presented in this disclosure, graphene will be used as an example of a two-dimensional layered material. However, other two-dimensional layered materials, such as phosphorene (black phosphorous), silicene, germanene, stanene, GaN, InN, InP, InAs, BAs, BP, or GaP, may also be used in any embodiment presented in this disclosure. Furthermore, the two-dimensional layered material used in any embodiment presented in this disclosure may also be a transition metal dichalcogenide or transition metal oxide, which includes $WE_2$, $MoE_2$, $ScE_2$, $TiE_2$, $HfE_2$, $ZrE_2$, $VE_2$, $CrE_2$, $MnE_2$, $FeE_2$, $CoE_2$, $NiE_2$, $NbE_2$, $TcE_2$, $ReE_2$, $PdE_2$, or $PtE_2$, where E is O, S, Se or Te. The two-dimensional material may comprise 1-10 atomic layers, with the total thickness ranging from 0.3 nm to 10 nm.

When prepared as two-dimensional layered materials with semiconducting or semimetal properties, all of these materials can be configured to exhibit the illumination-dependent electric potential described above when interfaced with a photoactive layer illuminated by electromagnetic radiation.

In the exemplary embodiments presented in this disclosure, quantum dots will be used as an example of a photoactive material with semiconducting electric properties. These quantum dots may comprise semiconductor nanocrystals or colloidal quantum dots selected from the group: PbS, PbSe, PbTe, CdS, CdSe, CdTe, ZnS, ZnO, CuS, $Cu_2S$, $Cu_2Se$, CZTS, MnS, $Bi_2S_3$, $Ag_2S$, $Ag_2Se$, HgTe, HgCdTe, GaSe, $MoS_2$, CIS, InAs, InSb, Ge, Si, graphene, or core/shell nanocrystals with any of the preceding core/shell constituents.

Alternatively, in any of the embodiments presented in this disclosure, the photoactive layer may comprise any of the preceding semiconductor nanocrystals or colloidal quantum dots embedded in a host material comprising metal chalcogenide, metal halide, or hybrid halide perovskite. The metal chalcogenide may have the general formula $ME_n$, where E is S, Se or Te, and it may for example be $AsS_x$, CdS, CdSe, CdTe, $CuInS_2$, $SnS_x$, $In_2Se$ or $Bi_2Te_3$. The metal halide may have the general formula MXn, where M is Pb, Bi, Cd, In, Zn, Sn, Cu, Fe, Ga, Li or Sb and X is I, Br or Cl, and it may for example be $PbI_2$ or $BiI_3$. The hybrid halide perovskite may have the general formula $ABX_3$, where A is Cs, $CH_3NH_3$ or $NH_2CH=NH_2$, B is Pb or Sn, and X is Cl, Br or I.

The quantum dot loading in the host material may vary between 1% and 90%. The diameter of the semiconductor nanocrystals or quantum dots may, for example, be in the range 2-20 nm. The photosensitive semiconductor materials may provide substantial optical absorption in the wavelength range of 0.4-5 μm, defined by the optical bandgap of materials used.

The capping ligands on the above semiconductor materials may comprise organic molecules or inorganic molecules, or a combination of both. Organic ligands may include, but are not limited to, alkyl or aryl thiols, such as 1,2-ethanedithiol, 3-mercaptopropionic acid, benzenethiol, etc. Organic ligands may also include alkyl or aryl amines, N-heterocycles, such as 1,2-ethylenediamine, pyridine, etc. Inorganic ligands may include atomic halogens (I, Br, Cl), pseudo halogens (SCN), or chalcogens (S, Se). Inorganic ligands may also include metal halides or metal chalcogenides.

However, in any of the embodiments presented in this disclosure, the photoactive layer may also be a thin-film semiconducting layer with a crystalline or amorphous structure. The thin-film semiconducting layer may comprise a material selected from the group: PbS, PbSe, PbTe, CdS, CdSe, CdTe, ZnS, ZnO, CuS, $Cu_2S$, $Cu_2Se$, CZTS, MnS, $Bi_2S_3$, $Ag_2S$, $Ag_2Se$, HgTe, HgCdTe, GaSe, $MoS_2$, CIS, InAs, InSb, Ge, or Si.

The photoactive layer may comprise a stack of multiple sublayers, where each sublayer comprises one of the semiconductor nanocrystal materials or thin-film semiconducting materials listed above. The electric properties of the materials in each sublayer may be selected so that a Schottky junction, a p-n junction, a p-i-n junction or an nBn junction, or a combination of several such heterostructures, is formed between two or more sublayers in the stack.

In this disclosure, the verb "cover" refers to vertical alignment with direct contact. When a first layer "covers" a second layer on a given area, the first layer and the second layer are vertically aligned on this area, and they are in direct contact with each other. In other words, the two layers have been sequentially deposited on a given area of the substrate. They are vertically aligned because the second layer has been deposited on this area first, and then the first layer has been deposited on the same area. Within this area, the second layer therefore lies below the first layer in the vertical direction. The first layer "covers" the second layer in this area because no other layers lie between the first and the second layer.

The verb "cover", when used with no further qualifiers, refers to complete vertical alignment where no area of the second layer is uncovered by the first layer. Qualified expressions such as "partly cover" are used to refer to partial vertical alignment, where there is an area of the second layer which is not covered by the first layer. Qualified expressions such as "at least partly cover" are used to refer to vertical alignment which can be either complete or partial.

In this disclosure, the verbs "overlie" and "underlie" refer to vertical alignment without direct contact. When a first layer "overlies" or "underlies" a second layer on a given area, the first layer and the second layer are vertically aligned, but they are not in direct contact with each other. In other words, the two layers have both been deposited on a given area of the substrate, but a third intervening layer has been deposited between them. These three layers are all vertically aligned on this area.

In addition to direct physical contact, the term "in contact with" can in this disclosure in some contexts mean electrical contact without direct physical contact. In other words, when the photoactive layer, or a portion of the photoactive layer, is in contact with the sensing electrode, the photoactive layer can be physically separated from the sensing electrode by an intermediate layer, such as a specialised electron or hole transport/blocking layer, but still be in contact with the sensing electrode because the intermediate layer is sufficiently thin to allow charge carriers to pass through it. If charge carriers can pass through the intermediate layer, for example by tunnelling, then the photoactive layer may still be considered to be "in contact with" the sensing electrode.

Photosensitive Device

This disclosure describes a photosensitive device located on a first region of a horizontal substrate surface. The device comprises a substantially horizontal first conductive electrode with a first side and a second side, which overlies at least the first region. The device also comprises a substantially horizontal first dielectric layer with a first side and a second side, wherein the first side of the first dielectric layer is in contact with the second side of the first conductive electrode at least in an area which overlies the first region. The device also comprises a substantially horizontal sensing electrode with a first side and a second side, wherein the sensing electrode consists of a two-dimensional layered material, and the first side of the sensing electrode is in contact with the second side of the first dielectric layer at least in an area which overlies the first region. The device also comprises a substantially horizontal photoactive layer with a first side and a second side, wherein the photoactive layer consists of a semiconducting material which can be configured to absorb electromagnetic radiation, and the first side of the photoactive layer is in contact with the second side of the sensing electrode at least in an area which overlies the first region.

Furthermore, the device comprises a single-ended measurement electrode for determining the electric potential of the sensing electrode. The measurement electrode is in contact with either the first or the second side of the sensing electrode in an area which overlies a contact region on the horizontal substrate surface.

In this disclosure, the term "single-ended measurement electrode" means an electrode which is configured to transmit the electric potential of the sensing electrode to external measurement circuitry. The term "single-ended" also means that the measurement electrode is not paired with another measurement electrode connected to the sensing electrode.

Even so, multiple measurement electrodes can be connected to the sensing electrode for backup purposes, for example. Other electrodes connected to the sensing electrode, such as reset electrodes, may also sometimes be used as measurement electrodes. But even if more than one measurement electrode is connected to the sensing electrode, they must be configured for a single-ended measurement if they are to be used for determining the potential of the sensing electrode. A single-ended measurement electrode is connected to a readout circuit configured for measuring electric potential They are not paired with other measurement electrodes connected to the same sensing electrode.

A single-ended measurement electrode, in the meaning used in this disclosure, does not and cannot set different parts of the sensing electrode to different electric potentials, and it cannot be used to drive a current through the sensing electrode or to perform a current measurement. All portions of the sensing electrode are at the same potential when the measurement is made. If the variable of interest would be a current passing through the sensing electrode, then a single-ended measurement electrode would be insufficient for performing the measurement. A double-ended measurement electrode, comprising a pair of electrodes connected to the sensing electrode and to a readout circuit configured for current measurement, would in that case be needed for setting a potential difference across the sensing electrode and measuring a current.

In other words, one single-ended measurement electrode connected to the sensing electrode is sufficient for outputting a voltage signal, proportional to incident light intensity, to the external readout circuitry connected to the photosensitive device. The readout circuit may be configured to measure the voltage between the single-ended measurement electrode and a reference potential. The single-ended measurement electrode may also be called a single measurement electrode.

First Device Embodiment

FIGS. 2a and 2b illustrate a first device embodiment. Reference numbers 21-25 and 261 correspond to reference numbers 11-15 and 161 in FIG. 1, respectively, but graphene will be used as an illustrative example of a sensing electrode material and a semiconductor nanocrystal (SNC) layer will be used as an illustrative example of a photoactive layer. FIG. 2b illustrates the meaning of the expressions "first side" and "second side" in FIG. 2a. The "first side" 291 of a given layer 29 is the lower side which faces the substrate, and the "second side" 292 is the upper side which faces away from the substrate. This terminology applies to all layers in the first region in FIG. 2a.

An alternative way to describe the stack of layers in the first region is that the first conductive electrode 23 covers the horizontal substrate surface in the first region, and that the first dielectric layer 24 covers the first conductive electrode in the first region. The sensing electrode 21 covers the dielectric layer at least in the first region. The photoactive layer 22 at least partly covers the sensing electrode 21 in the first region. All of these layers 21-24 overlie the first region 261.

The device illustrated in FIG. 2a also comprises a single-ended measurement electrode 27. The measurement electrode 27 is in contact with the first side of the sensing electrode 21 in an area which overlies a contact region 262 on the horizontal substrate surface. The measurement electrode could alternatively be in contact with the second side of the graphene layer 21, or even with both the first side and the second side of graphene layer 21.

It is convenient in most device geometries to arrange the contact region 262 separately from the first region 261 on the substrate surface, by letting the sensing electrode extend outside of the first region 261, as illustrated in FIG. 2a. However, the first region may, for example, encircle the contact region. In some device geometries, the contact region may overlap with the first region. The contact region can be significantly smaller than the first region because it does not have to carry a current signal. Furthermore, because the potential of the sensing electrode is the same across its entire surface, the measurement electrode 27 can be contacted to the graphene layer 21 in any freely selectable location on the graphene layer 21. This opens up new possibilities in the pixel geometry of the photosensitive device, as described in more detail below.

In any embodiment presented in this disclosure, both the graphene layer 21 and the photoactive layer 22 may extend beyond the first region 261. They may, for example, cover an entire pixel. They may overlie the contact region 262 if the single-ended measurement electrode 27 is connected only to the first side of the graphene layer 21, as in FIG. 2a.

A voltage $V_{BG}$ is applied to the first conductive electrode 23, and an output voltage $V_G$ can be read from the graphene layer 21 by external circuitry, as illustrated in FIG. 2c. The graphene layer 21 and the first conductive electrode 23 form a capacitor. The thickness of the first dielectric layer 24 may typically be in the range of 50 nm to 300 nm, but it can even be as low as 5-50 nm or as thick as 300-1000 nm. The thickness of the semiconductor nanocrystal layer 22 may be optimized depending on the material.

The photosensitive device may be operated in two alternating modes: a capture mode during which the device is exposed to electromagnetic radiation, and a readout mode during which an output voltage, proportional to the radiation intensity incident on the device in the previous capture mode, may be read from the single-ended measurement electrode. A third mode, which may be called the reset mode, may optionally follow the readout mode. It will be described in more detail in the fifth device embodiment below.

In capture mode, the graphene layer 21 is allowed to float at any potential that it may obtain. Preferably, the potential is set such that the depletion region of the semiconductor nanocrystal layer is enlarged, the built-in electric field is maximised, and the transfer of the minority carrier type from the semiconductor to graphene is most efficient (nearly free of energy barriers). If photons are absorbed in the photoactive layer, the excitons are separated by the built-in field in the manner described above, and charges accumulate in the graphene layer to balance those trapped in the semiconductor nanocrystal layer 22. Because the charges cannot flow out of the graphene layer 21, and because the capacitance $C_0$ is assumed to remain unchanged, the electric potential $V_G$ of the graphene layer 21 changes. Practically no current is driven through the device when it is operated, so it consumes very little power. The voltage-output of the device is determined by the photo-induced change in the voltage across the interface between graphene and semiconductor nanocrystals. Although the junction voltage depends on the Fermi levels of graphene and semiconductor nanocrystals, the output of the photosensitive device is not as sensitive to the voltage $V_{BG}$ as a graphene field-effect transistor is to the gate voltage. The device is also tolerant to defects and discontinuities in the graphene layer when only the electric potential of the graphene layer is a variable of interest.

The measurement electrode 27 may be coupled to a readout circuit with high input impedance so that the charge in the graphene layer does not leak out during measurement. Since the measurement electrode only measures voltage, the contact resistance between this electrode and the graphene layer does not necessarily have to be very low. The same consideration applies to the reset electrodes discussed below.

FIG. 2c illustrates an exemplary measurement circuit, where $V_O=A \cdot V_G+(1-A) \cdot V_{REF}$, where A is the amplifier gain. The measurement electrode 27 may make galvanic contact to a relatively small contact area on the graphene layer 21, and the lead-out from the measurement electrode 27 may be connected to the non-inverting input terminal of an operational amplifier in the exemplary circuit of FIG. 2c.

The measurement circuit requires only one precise voltage reference. The electric potential $V_G$ determined from the single-ended measurement electrode is measured as the potential difference between the sensing electrode 21 and a common reference potential $V_R$. The magnitudes of $V_{BG}$ and $V_{REF}$ in the measurement circuit shown in FIG. 2c should also be set against this common reference potential $V_R$ as accurately as possible. The common reference potential $V_R$ may be the ground potential or some other fixed potential in the device.

In an alternative configuration, the lead-out from the measurement electrode 27 may be connected to a charge amplifier circuit. In this configuration, the negative feedback capacitor of the charge amplifier circuit forces the potential of the sensing electrode to remain at a pre-defined reference level, and the amplifier output provides a measure of the photogenerated charge at the sensing electrode. This is illustrated in FIG. 2d, where the element 288 is a low-leakage reset switch.

In an alternative implementation, the feedback control is obtained by dynamically adjusting the voltage $V_{BG}$ applied to the first conductive electrode 23 to compensate for the photoinduced charge so that the potential of the sensing electrode remains at a pre-defined level throughout the capture sequence while the feedback circuitry captures the measure of photoinduced charge.

Alternatively, the measurement electrode 27 may be in direct contact with the metal gate electrode of a MOSFET preamplifier. This is illustrated in FIG. 2e. Alternatively, the sensing electrode 21 may be capacitively coupled to the metal gate electrode of a MOSFET preamplifier. This is illustrated in FIG. 2g, where 26 is the coupling electrode directly connected to the MOSFET preamplifier gate. The coupling electrode is located beneath the sensing electrode 21 and separated from the sensing electrode 21 by a dielectric layer. In this configuration, no galvanic connection is made between the MOSFET gate and the sensing electrode.

Alternatively, the measurement electrode 67 may itself form the MOSFET gate electrode in the preamplifier. This is illustrated in FIG. 2i. The substrate 25 may be a CMOS substrate where a field-effect transistor is formed from source electrode 28S, drain electrode 28D, and the channel 29 which is separated from the graphene layer 21 only by the first dielectric layer 24. The same circuit arrangement is illustrated schematically in FIG. 2j, where 282 is the preamplifier FET. In the devices illustrated in FIGS. 2e, 2g and 2i, optimum sensitivity may be obtained when the capacitance of the 23/21 capacitor matches the input capacitance of the read-out front-end. In the corresponding circuits illustrated in FIGS. 2f, 2h and 2k, this input capacitance corresponds to the gate-to-source capacitance $C_{gs}$ of the preamplifier FET 282. In the device illustrated in FIG. 2g, the coupling capacitance may be greater than $C_{ox}$ and $C_{gs}$. FIG. 2l illustrates a measurement circuit where 286 is a bias voltage source, 281 is a reset switch and 282 is again the preamplifier FET.

Any of these alternative interfaces between the sensing electrode 21 and the read-out electronics may be implemented in any embodiment presented in this disclosure.

Second Device Embodiment

FIG. 3a illustrates an embodiment where the stack of layers has been deposited in the opposite order on the substrate surface. Reference numbers 31-34 correspond to reference numbers 21-24 in FIG. 2a, respectively. The first region and contact region have not been separately illustrated, but they correspond to the regions indicated in FIG. 2a. Graphene is again used as an illustrative example of a sensing electrode material and a semiconductor nanocrystal (SNC) layer is used as an illustrative example of a photoactive layer.

FIG. 3b illustrates the meaning of the expressions "first side" and "second side" in FIG. 3b. This time the "first side" 391 of a given layer 39 is the upper side which faces away from the substrate, and the "second side" 392 is the lower side which faces toward the substrate. This terminology applies to all layers in the first region in FIG. 3a.

An alternative way to describe the stack of layers in the first region is that the photoactive layer 32 covers the horizontal substrate surface in the first region, and that the sensing electrode 31 covers the photoactive layer in the first region. The first dielectric layer 34 covers the sensing electrode 31 at least in the first region, and the first conductive electrode 33 covers the first dielectric layer 34 at least in the first region. All of these layers 31-34 overlie the first region. An additional, patterned dielectric layer 38 may be needed on the horizontal substrate surface to provide a level surface where the sensing electrode can be deposited so that it extends outside of the first region.

The same measurement circuitry described in the first device embodiment may be used to measure the output signal also from the photosensitive device illustrated in FIG. 3a.

In order to not extend this disclosure unduly, all of the subsequent device embodiments will be presented in a configuration where the first side and the second side of each layer correspond to the order presented above in the first device embodiment and illustrated in FIG. 2b. However, the alternative order used in this second device embodiment, and illustrated in FIG. 3b, is an alternative way to implement the device in all of the subsequent embodiments.

Third Device Embodiment

The photosensitive device may also comprise a substantially horizontal second conductive electrode with a first side and a second side, and the first side of the second conductive electrode may be in contact with the second side of the photoactive layer in an area which at least partly overlies the first region.

FIG. 4a illustrates a photosensitive device according to this third embodiment. Reference numbers 41-44 and 47 correspond to reference numbers 21-24 and 27 in FIG. 2a, respectively. The first region and contact region have not been separately illustrated, but they correspond to the regions indicated in FIG. 2a. Graphene is again used as an illustrative example of a sensing electrode material and a semiconductor nanocrystal (SNC) layer is used as an illustrative example of a photoactive layer 42. The device comprises a second conductive electrode 48 which covers the photoactive layer 42 in the first region, as illustrated in FIG. 4a.

The second conductive electrode 48 can form either an Ohmic or a Schottky contact to the semiconductor nanocrystal layer 42. If, for example, a metal such as Al is used in the second conductive electrode 48, it will form a Schottky barrier to the semiconductor nanocrystals. A double barrier structure, where both interfaces exhibit Schottky barriers, may then be obtained in the semiconductor nanocrystal layer, and the height of the barrier at the 42/48 interface may be regulated by changing the voltage applied to the second conductive electrode 48. In other words, the voltage $V_{FG}$ can alternate between a first value in the capture mode and the readout mode, when charge carriers should remain trapped in the layer 42, and a second value in the optional reset mode, when charge carriers may be discharged from the semiconductor nanocrystal layer 42.

When the first and second conductive electrodes 43 and 48 are set to given voltages, the voltage potential of the graphene layer 41 lies somewhere between these two. The charges separated by the built-in field between semiconductor nanocrystal layer 42 and the graphene layer 41 remain trapped in these two layers.

Since photosensitive device is illuminated from the direction of the positive z-axis in FIG. 5, the second conductive electrode should be at least partly transparent. The second conductive electrode may be a transparent conductive oxide. If a metallic material is used in the second conductive electrode, it should be so thin that it allows a sufficient amount of light transmission. The second conductive electrode may also be called a top gate electrode.

The measurement electrode 47 may be coupled to a readout circuit with high input impedance so that the charge in the graphene layer does not leak out during measurement. FIG. 4b illustrates an exemplary measurement circuit, which also includes circuitry for an optional reset electrode which connected to the graphene layer 41 (this option is not illustrated in FIG. 4a but will be discussed in the fifth device embodiment below).

Fourth Device Embodiment

In addition to the features specified in the first and the second device embodiment above, the photosensitive device may also comprise substantially horizontal second dielectric layer with a first side and a second side, and the first side of the second dielectric layer may be in contact with the second side of the photoactive layer in an area which at least partly overlies the first region. The device may also comprise a substantially horizontal second conductive electrode with a first side and a second side, and the first side of the second conductive electrode may be in contact with the second side of the second dielectric layer in an area which at least partly overlies the first region.

FIG. 5 illustrates a photosensitive device according to this fourth embodiment. Reference numbers 51-54 and 57 correspond to reference numbers 21-24 and 27 in FIG. 2a, respectively. Again, the first region and contact region have not been separately illustrated, but they correspond to the regions indicated in FIG. 2a. And graphene is again used as an illustrative example of a sensing electrode material and a semiconductor nanocrystal (SNC) layer is used as an illustrative example of a photoactive layer 52. The device comprises a second dielectric layer 56 which covers the semiconductor nanocrystal layer 52 in the first region, and a second conductive electrode 58 which covers the semiconductor nanocrystal layer 42 in the first region, as illustrated in FIG. 5.

In this configuration, the second conductive electrode cannot inject or extract charges from the semiconductor nanocrystal 52. In other words, it cannot apply a reset functionality to the photoactive layer. However, it provides a biasing electric field capable of extending or shrinking the width of the depletion layer in the semiconducting nanocrystal layer 52 at the 51/52 interface. This may allow the second conductive electrode to toggle the device between an active capture-mode, where the depletion layer is extended and the electric field enhances the charge trapping in the layer 52, and a shutter-mode where the field is reversed or weakened, enabling the so-called flat band condition with minimum charge carrier separation in the semiconductor nanocrystals upon photoexcitation.

As in the third device embodiment, the second conductive electrode 58 may be a transparent conductive oxide. If a metallic material is used in the second conductive electrode, it should be so thin that it allows a sufficient amount of light transmission.

The measurement circuit illustrated in FIG. 4b may be employed also with the device illustrated in FIG. 5.

Fifth Device Embodiment

In addition to the features specified in the first, second, and third or fourth device embodiment above, the photosensitive device may also comprise a reset electrode for transferring charge carriers to or from the sensing electrode. The reset electrode may be in contact with either the first or the second side of the sensing electrode in an area which overlies a reset region on the horizontal substrate surface.

FIG. 6a illustrates a photosensitive device according to this fifth embodiment. Reference numbers 61-65 and 67 correspond to reference numbers 21-25 and 27 in FIG. 2a, respectively. Again, the first region and contact region have not been separately illustrated, but they correspond to the regions indicated in FIG. 2a. Graphene is again used as an illustrative example of a sensing electrode material and a semiconductor nanocrystal (SNC) layer is used as an illustrative example of a photoactive layer 62.

The graphene layer 61 extends beyond the first region to the contact region, as in the previous embodiments, but it also extends outside of the first region to a reset region 663, where a reset electrode 68 is in contact with the graphene layer. Like the measurement electrode 27, 37, 47, 57 and 67 in the previous embodiments and in this embodiment, the reset electrode 68 may also be in contact with either side of the graphene layer 61, or with both sides of this layer. The first region and/or contact region may surround the reset region or overlap with the reset region. A switch, illustrated at the bottom left corner of FIG. 6a, may be kept open in the capture mode and the readout mode, and closed when the photosensitive device is in reset mode. A voltage $V_{RESET}$, suitable for transferring charge carriers to or from the graphene layer 21, may be applied to the graphene layer in the reset mode.

However, it is also possible to use one electrode as both the measurement electrode 67 and as the rest electrode 68. This alternative is illustrated in FIG. 6b. The readout and reset modes may become slightly slower in this configuration than if two separate electrodes would be used, but the circuitry required near the photosensitive device is simplified.

FIG. 6c illustrates an exemplary measurement circuit for the device illustrated in FIG. 6a. Other circuit arrangements could also be used.

Sixth Device Embodiment

The sixth device embodiment may be implemented together with any of the preceding five device embodiments. In this embodiment, the first conductive electrode, the first dielectric layer and the photoactive layer in the photosensitive device also overlie a reference pixel region which is adjacent to the first region. The device comprises a substantially horizontal reference electrode with a first side and a second side, wherein the reference electrode consists of a two-dimensional layered material. The first side of the first dielectric layer is in contact with the second side of the first conductive electrode also in an area which overlies the reference pixel region. The first side of the reference electrode is in contact with the second side of the first dielectric layer in an area which overlies the reference pixel region. The first side of the photoactive layer is in contact with the second side of the reference electrode also in an area which overlies the reference pixel region, The device also comprises a single-ended reference measurement electrode for determining the electric potential of the reference electrode. The reference measurement electrode is in contact with either the first or the second side of the reference electrode in an area which overlies a reference contact region. The device also comprises a masking layer which overlies the reference pixel region, so that much less electromagnetic radiation is absorbed in the photoactive layer in the reference pixel region than in the first region.

The reference pixel allows compensations to be calculated for errors which relate to drift, doping level variation across a pixel array, thermal offset and other factors which could potentially cause systematic measurement errors. The first region and reference pixel region can share the same first conductive electrode, first dielectric layer and photoactive layer.

If a second dielectric layer and/or a second conductive electrode is used on top of the photoactive layer in the first region, then these layers can also overlie the reference pixel region which is adjacent to the first region, and they may be stacked in the reference pixel region in the same order as they are stacked in the first region.

Using graphene as an illustrative example of a sensing electrode material, it can be understood from the description above that the first region and reference pixel region do not share the same graphene electrode. Nevertheless, because these regions are located right next to each other, the graphene quality can be assumed to be very uniform in the two regions (same doping level).

The measurement signal from the photosensitive device can be read from the single-ended measurement electrode and the single-ended reference measurement electrode in differential mode: if the photosensitive device is not illuminated, there will be a negligible difference between the output voltage from the graphene layer in the sensing electrode and the graphene layer in the reference electrode. When the photosensitive device is illuminated, much less radiation will reach the photoactive layer in the reference region because it is shadowed by the masking layer, and a voltage difference without any offset or drift errors can be measured. The masking layer may be a layer of any suitable opaque and dielectric material which can be deposited over the topmost layer in the photosensitive device.

FIG. 7a illustrates an exemplary square-shaped pixel geometry for this embodiment in the horizontal xy-plane. The reference pixel region 764 lies adjacent to the first region 761. It should be remembered that only the graphene layer has to be patterned to separate these two regions from each other, although other layers in the stack could optionally be patterned also. A measurement electrode is in contact with the first region graphene layer in an area which overlies contact region 762, and a reference measurement electrode is in contact with the reference pixel graphene layer in an area which overlies a reference contact region 765.

FIG. 7b illustrates the same regions in an exemplary circular geometry. FIG. 7c illustrates an exemplary measurement circuit for differentially reading the output $V_G$ from the first region and the reference output $V_{G,ref}$ from the reference region.

Photodetector

A photodetector comprises an array of photosensitive devices. The photosensitive devices described in the preceding device embodiments can be conveniently scaled to larger arrays because some of the layers can be prepared over multiple pixels, or even across the entire array, without pixel-specific patterning.

This disclosure describes a photodetector comprising an array of two or more photosensitive devices on a horizontal substrate surface which comprises two or more first regions, where each photosensitive device is located on a first region. The photodetector comprises one or more substantially horizontal first conductive electrodes and one or more substantially horizontal first dielectric layers, wherein each first conductive electrode and each first dielectric layer has a first side and a second side, and the first side of each first dielectric layer is in contact with the second side of the corresponding first conductive electrode at least in an area which overlies one or more first regions on the substrate surface.

The photodetector also comprises a substantially horizontal sensing electrode overlying each first region, so that each sensing electrode is dedicated to a specific first region. Each sensing electrode consists of a two-dimensional layered material, and each sensing electrode has a first side and a second side, and the first side of each sensing electrode is in contact with the second side of the corresponding first dielectric layer in an area which overlies the corresponding first region.

The photodetector also comprises one or more substantially horizontal photoactive layers. Each photoactive layer has a first side and a second side, and the first side of each photoactive layer is in contact with the second side of at least one sensing electrode in areas which overlie at least one first region on the substrate surface, Each photosensitive device comprises a single-ended measurement electrode for determining the electric potential of the corresponding sensing electrode, and the single-ended measurement electrode is in contact with either the first or the second side of the corresponding sensing electrode in an area which overlies a contact region on the horizontal substrate surface.

Each photosensitive device may also comprise one or more substantially horizontal second conductive electrodes. Each second conductive electrode may have a first side and a second side, and the first side of each second conductive electrode may be in contact with the second side of at least one photoactive layer in areas which overlie at least one first region on the substrate surface.

Alternatively, each photosensitive device may comprise one or more substantially horizontal second dielectric layers with a first side and a second side, and the first side of each second dielectric layer may be in contact with the second side of at least one photoactive layer in areas which overlie at least one first region on the substrate surface. The same photosensitive device may also comprise one or more substantially horizontal second conductive electrodes. Each second conductive electrode may have a first side and a second side, and the first side of each second conductive electrode may be in contact with the second side of at least one second dielectric layer in areas which overlie at least one first region on the substrate surface.

Photodetector device structures will in the following be presented in a configuration where the first side and the second side of each layer correspond to the order presented above in the first device embodiment, and illustrated in FIG. 2b. However, the alternative order which was used in the second device embodiment and illustrated in FIG. 3b, is an alternative way to implement each photodetector.

FIG. 8a illustrates a photodetector with two pixels. A first photosensitive device has been prepared on one first region 8611 of the horizontal substrate surface, and a second photosensitive device has been prepared on another first region 8612. One first conductive electrode 83 covers at least both first regions on the substrate surface, and one first dielectric layer 84 covers the first conductive electrode at least in the first regions.

The first pixel comprises a first sensing electrode 811 which covers the dielectric layer at least in first region 8611. The second pixel comprises a second sensing electrode 812 which covers the dielectric layer at least in first region 8612.

Finally, the illustrated photodetector also comprises a photoactive layer which covers the first and the second sensing electrodes 811 and 812 at least in the first regions 8611 and 8612. The crosstalk between neighbouring pixels sharing a common photoactive layer will depend on the material chosen for this layer and on pixel size and geometry. It may in some cases be preferable to pattern the photoactive layer, so that a separate photoactive layer covers the corresponding sensing electrode in each first region. This option has not been separately illustrated.

The first pixel also comprises a first single-ended measurement electrode 871, which is in contact with the first sensing electrode 811 in an area which overlies a first contact region 8621. Correspondingly, the second pixel comprises a second single-ended measurement electrode 872, which is in contact with the second sensing electrode 812 in an area which overlies a second contact region 8622.

The photodetector may comprise many more pixels, and the layers 82-84 which overlies both first regions in FIG. 8a may overlie all other first regions on the substrate as well. These layers may also extend across any intervening regions between the first regions, although the first conductive electrode 83 must in the illustrated configuration have a suitable opening in each contact region where the lead from the measurement electrode can pass through.

As illustrated in FIG. 8a, a single lead may be sufficient to set the first conductive electrode 83 to the desired voltage $V_{BG}$ across all pixels in the photodetector, and a reset functionality can optionally be added to the measurement electrodes 871 and 872 in the manner described in the fifth device embodiment above.

Each photosensitive device may comprise a reset electrode for transferring charge carriers to or from the sensing electrode. Each reset electrode may be in contact with either the first or the second side of the corresponding sensing electrode in an area which overlies a reset region on the horizontal substrate surface.

FIG. 8b illustrates an alternative implementation where first and second reset electrodes 881 and 882 have been implemented in contact with the first and second sensing electrodes 811 and 812, respectively. In this case, the first conductive electrode 83 should also have openings for reset electrode leads which extend towards the substrate.

FIG. 8c illustrates a circuit for implementing the device illustrated in FIG. 8b as part of a pixel array. The circuit includes a bias voltage source 896, reset switch 891, preamplifier FET 892, load 893, and pixel selection switch 894 which can be configured to connect the pixel to the bus 895.

The first conductive electrode may extend across all pixels. A benefit of using a common first conductive electrode 83 for all pixels in an array is that the first conductive electrode can then be implemented as a continuous or almost continuous sheet, which may provide electrical shielding for example from CMOS layers below each photosensitive device. FIG. 8d illustrates a photodetector constructed on a CMOS substrate 851. The first conductive electrode 83 and the contact and reset electrodes 871-872 and 881-882 have been patterned from the same metal layer. The measurement electrode 83 may surround the contact and reset electrodes 871-872 and 881-882 in the xy-plane. The first dielectric layer 84 has been patterned to allow the sensing electrodes 811 and 812 to come into contact with the contact and reset electrodes 871-872 and 881-882, as illustrated in the figure.

The illustrated device also includes a second conductive electrode 88. The second conductive electrode may extend across all pixels in any photodetector where it is present. A second dielectric layer could optionally be deposited between the photoactive layer 82 and the second conductive electrode 88. This layer has not been illustrated, but it may also extend across all pixels of the photodetector.

The photoactive layer 82 may also extend across all pixels in any of the photodetectors presented in this disclosure. Alternatively, the photoactive layer 82 may be patterned into multiple, electrically separated photoactive layers. The number of such photoactive layers may be equal to the number of pixels, so that each photoactive layer is dedicated to a specific pixel.

FIG. 8e illustrates schematically a photodetector which comprises multiple photosensitive device pixels on a CMOS substrate 851. The sensing electrodes 811-819 of the pixels are connected to separate readout circuits. The first conductive electrode 83 and the photoactive layer 82 are unpatterned, except for the openings in 83 which allow each readout circuit to be coupled to the corresponding sensing electrode. A dielectric layer and/or second conductive electrode are not illustrated in FIG. 8e, but they could optionally overlie the entire pixel array. Additional encapsulation layers may be deposited over the electrically active device layers. These encapsulation layers should be at least partly transparent on the top side of the photodetector.

Pixel Geometry in the Xy-Plane

Assuming that the size of a device pixel is sufficiently small, and that the conductivity of the two-dimensional material used in the sensing electrode is sufficiently high, the geometry of the photosensitive device in the xy-plane will not be restricted by the placement of the measurement electrodes because the potential of the sensing electrode will be the same across the entire sensing electrode. If the two-dimensional material has a relatively low conductivity, the size of the pixel may have to be smaller than the pixel size used in devices employing high-conductivity two-dimensional materials.

Figure 9A:
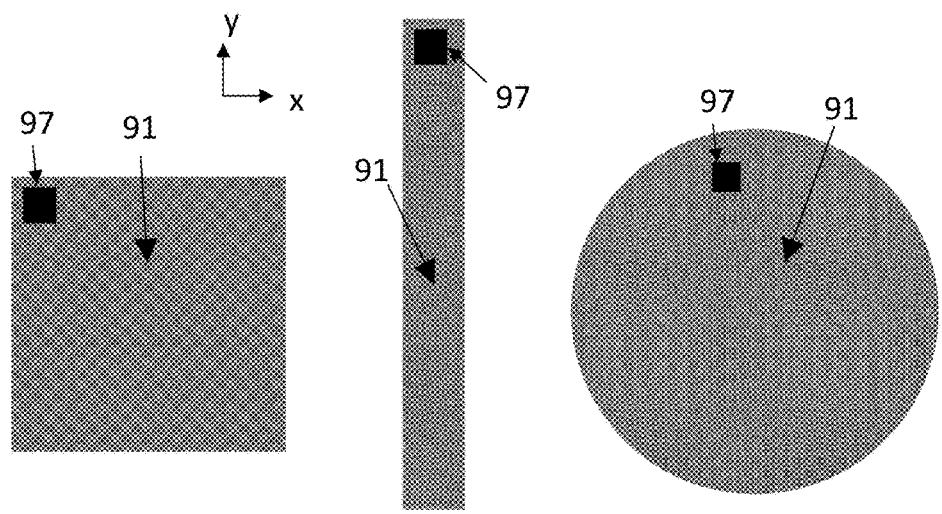

Apart from these constraints, pixel geometry can in general be selected much more freely in the photosensitive devices described in this disclosure than in devices where a field-effect transistor geometry is used, because the geometry of the devices described in this disclosure is not limited by current collection requirements across the first region. When only the electric potential of the sensing electrode needs to be measured, the measurement electrode can be placed in contact with the sensing electrode at any suitable location. FIG. 9a illustrates a sensing electrode 91 and a measurement electrode 97 in three exemplary geometries from left to right: a square geometry, a line geometry and a circular geometry. The first may for example be used in a VGA imager, the second in a linear array, and the third in a single-pixel device where only one large pixel is needed.

Figure 9B:
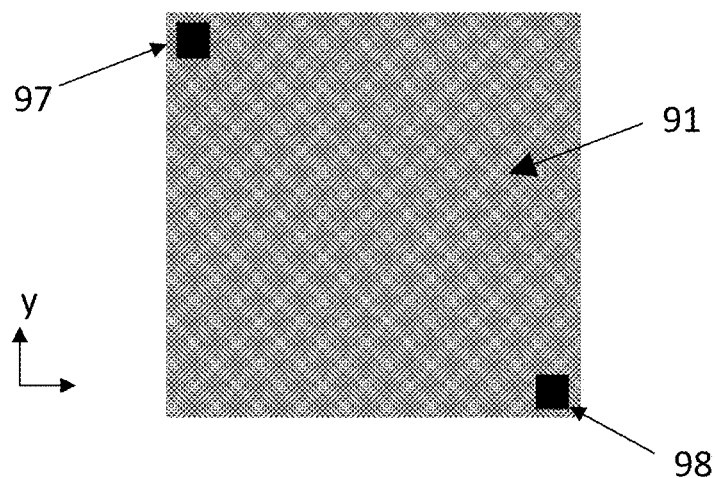

FIG. 9b illustrates a pixel geometry which may, for example, be employed for the device illustrated in FIG. 6a. Reference numbers 97 and 98 then correspond to reference numbers 67 and 68, respectively, and the measurement electrode and reset electrode are located in two corners of the square-shaped sensing electrode.

Figure 9C:
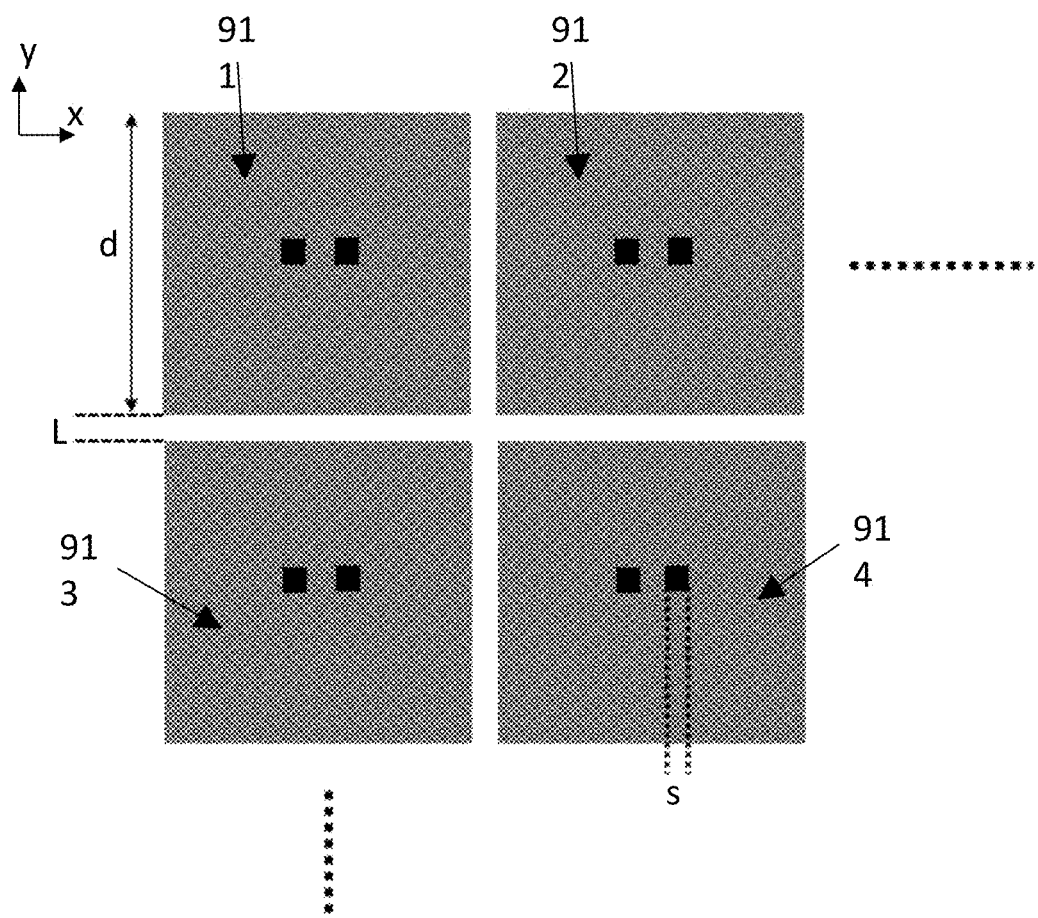

FIG. 9c illustrates exemplary pixel and array dimensions. Four sensing electrodes 911-914 are illustrated. The width d of one sensing electrode may for example be in the range 5-50 µm. The distance L between adjacent pixels may, for example, be 0.1-3 µm. The width s of a measurement electrode and/or reset electrode may, for example, be 0.5-5 µm. Placing the measurement electrodes and reset electrodes in the center of the pixel in the manner illustrated in FIG. 9c may be beneficial because it gives more tolerance to alignment errors. Even if the patterning of the sensing electrodes is slightly misaligned in relation to the measurement and reset electrodes (or vice versa), the measurement and reset electrodes will still lie within the first region of each photosensitive device.

Figure 9D:
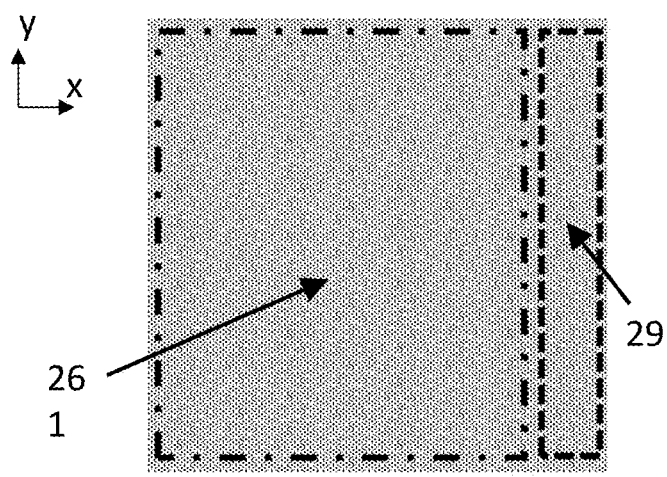
Figure 9E:
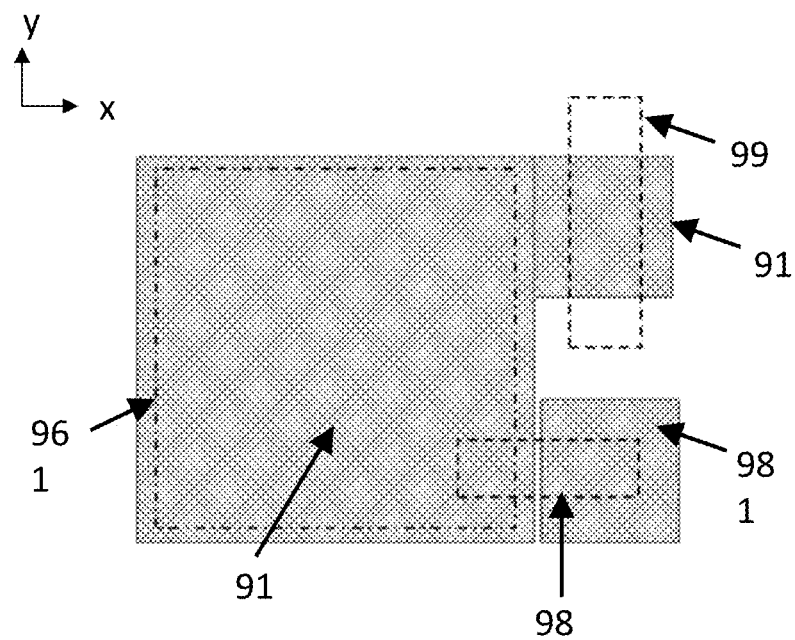

FIG. 9d illustrates a geometry which may be used in the device shown in FIG. 2i. The active pixel area lies adjacent to the CMOS field-effect transistor channel 29. A similar geometry may be used for the device shown in FIGS. 2e and 2g. FIG. 9e illustrates an exemplary pixel geometry which includes an active-pixel area 961, a reset switch 981 connected with a reset electrode 98 to the sensing electrode 91 and the channel 99 of a preamplifier field-effect transistor which is gated by the sensing electrode 91.

What is claimed is:

1. A photosensitive device located on a first region of a horizontal substrate surface, the photosensitive device comprising:
    a substantially horizontal first conductive electrode with a first side and a second side, which overlies at least the first region;
    a substantially horizontal first dielectric layer with a first side and a second side, wherein the first side of the first dielectric layer is in contact with the second side of the first conductive electrode at least in an area which overlies the first region;
    a substantially horizontal sensing electrode with a first side and a second side, wherein the sensing electrode consists of a two-dimensional layered material, and the first side of the sensing electrode is in contact with the second side of the first dielectric layer at least in an area which overlies the first region;
a substantially horizontal photoactive layer with a first side and a second side, wherein the photoactive layer consists of a semiconducting material which can be configured to absorb electromagnetic radiation, and the first side of the photoactive layer is in contact with the second side of the sensing electrode at least in an area which overlies the first region; and
a single-ended measurement electrode for determining the electric potential of the sensing electrode, wherein the measurement electrode is in contact with either the first side or the second side of the sensing electrode in an area which overlies a contact region on the horizontal substrate surface.

2. The photosensitive device of claim 1, further comprising a substantially horizontal second conductive electrode with a first side and a second side, and the first side of the second conductive electrode is in contact with the second side of the photoactive layer in an area which at least partly overlies the first region.

3. The photosensitive device of claim 1, further comprising:
a substantially horizontal second dielectric layer with a first side and a second side, and the first side of the second dielectric layer is in contact with the second side of the photoactive layer in an area which at least partly overlies the first region; and
a substantially horizontal second conductive electrode with a first side and a second side, and the first side of the second conductive electrode is in contact with the second side of the second dielectric layer in an area which at least partly overlies the first region.

4. The photosensitive device of claim 1, further comprising a reset electrode for transferring charge carriers to or from the sensing electrode, wherein the reset electrode is in contact with either the first or the second side of the sensing electrode in an area which overlies a reset region on the horizontal substrate surface.

5. The photosensitive device of claim 1, further comprising:
a substantially horizontal reference electrode with a first side and a second side, wherein the reference electrode consists of a two-dimensional layered material;
a single-ended reference measurement electrode for determining the electric potential of the reference electrode, wherein the reference measurement electrode is in contact with either the first or the second side of the reference electrode in an area which overlies the reference contact region; and
a masking layer which overlies the reference pixel region, so that much less electromagnetic radiation is absorbed in the photoactive layer in the reference pixel region than in the first region, wherein:
the first conductive electrode, the first dielectric layer, and the photoactive layer also overlie a reference pixel region which is adjacent to the first region,
the first side of the first dielectric layer is in contact with the second side of the first conductive electrode also in an area which overlies the reference pixel region,
the first side of the reference electrode is in contact with the second side of the first dielectric layer in an area which overlies the reference pixel region, and
the first side of the photoactive layer is in contact with the second side of the reference electrode also in an area which overlies the reference pixel region.

6. A photodetector, comprising:
an array of two or more photosensitive devices on a horizontal substrate surface which comprises two or more first regions, where each photosensitive device is located on a first region;
one or more substantially horizontal first conductive electrodes and one or more substantially horizontal first dielectric layers, wherein each first conductive electrode and each first dielectric layer has a first side and a second side, and the first side of each first dielectric layer is in contact with the second side of the corresponding first conductive electrode at least in an area which overlies one or more first regions on the substrate surface;
a substantially horizontal sensing electrode overlying each first region, so that each sensing electrode is dedicated to a specific first region, wherein each sensing electrode consists of a two-dimensional layered material, and each sensing electrode has a first side and a second side, and the first side of each sensing electrode is in contact with the second side of the corresponding first dielectric layer in an area which overlies the corresponding first region;
one or more substantially horizontal photoactive layers, wherein each photoactive layer has a first side and a second side, and the first side of each photoactive layer is in contact with the second side of at least one sensing electrode in areas which overlie at least one first region on the substrate surface,
wherein each photosensitive device comprises a single-ended measurement electrode for determining the electric potential of the corresponding sensing electrode, and the single-ended measurement electrode is in contact with either the first or the second side of the corresponding sensing electrode in an area which overlies a contact region on the horizontal substrate surface.

7. The photodetector of claim 6, wherein:
each photosensitive device also comprises one or more substantially horizontal second conductive electrodes, and
each second conductive electrode has a first side and a second side, and the first side of each second conductive electrode is in contact with the second side of at least one photoactive layer in areas which overlie at least one first region on the substrate surface.

8. The photodetector of claim 6, wherein each photosensitive device also comprises:
one or more substantially horizontal second dielectric layers with a first side and a second side, and the first side of each second dielectric layer is in contact with the second side of at least one photoactive layer in areas which overlie at least one first region on the substrate surface; and
one or more substantially horizontal second conductive electrodes, wherein each second conductive electrode has a first side and a second side, and the first side of each second conductive electrode is in contact with the second side of at least one second dielectric layer in areas which overlie at least one first region on the substrate surface.

9. The photodetector of claim 6, wherein one second conductive electrode extends across all pixels.

10. The photodetector of claim 6, wherein the number of photoactive layers equals the number of pixels, so that each photoactive layer is dedicated to a specific pixel.

11. The photodetector of claim 6, wherein one photoactive layer extends across all pixels.

12. The photodetector of claim 6, wherein one first conductive electrode extends across all pixels.

13. The photodetector of claim 6, wherein:
- each photosensitive device also comprises a reset electrode for transferring charge carriers to or from the sensing electrode, and
- each reset electrode is in contact with either the first side or the second side of the corresponding sensing electrode in an area which overlies a reset region on the horizontal substrate surface.

* * * * *